United States Patent
Ohta et al.

(10) Patent No.: US 8,829,447 B2
(45) Date of Patent: Sep. 9, 2014

(54) PHOTOELECTRIC CONVERSION SUBSTRATE, RADIATION DETECTOR, RADIOGRAPHIC IMAGE CAPTURE DEVICE, AND MANUFACTURING METHOD OF RADIATION DETECTOR

(75) Inventors: Yasunori Ohta, Kanagawa (JP); Keiichiro Sato, Kanagawa (JP); Naoyuki Nishino, Kanagawa (JP); Haruyasu Nakatsugawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 43 days.

(21) Appl. No.: 13/561,102

(22) Filed: Jul. 30, 2012

(65) Prior Publication Data

US 2013/0048863 A1   Feb. 28, 2013

(30) Foreign Application Priority Data

Aug. 26, 2011   (JP) ................. 2011-185238

(51) Int. Cl.
G01T 1/20 (2006.01)
H01L 27/146 (2006.01)
H01L 27/30 (2006.01)

(52) U.S. Cl.
CPC ........ *H01L 27/308* (2013.01); *H01L 27/14687* (2013.01); *H01L 27/14632* (2013.01); *G01T 1/2018* (2013.01); *H01L 27/14609* (2013.01)
USPC ...................................... 250/366

(58) Field of Classification Search
CPC ..................... H01L 27/14609; G01T 1/2018
USPC ...................................... 250/366
See application file for complete search history.

(56) References Cited

U.S. PATENT DOCUMENTS

| | | | | |
|---|---|---|---|---|
| 6,600,158 | B1* | 7/2003 | Okada et al. | 250/370.11 |
| 7,820,493 | B1* | 10/2010 | Cheng et al. | 438/132 |
| 2006/0044561 | A1* | 3/2006 | Nii | 356/434 |
| 2006/0108683 | A1* | 5/2006 | Takeda | 257/723 |
| 2008/0237448 | A1* | 10/2008 | Simony | 250/208.1 |
| 2009/0168126 | A1* | 7/2009 | Saito et al. | 358/496 |
| 2011/0006213 | A1* | 1/2011 | Sato et al. | 250/367 |
| 2011/0180716 | A1* | 7/2011 | Okada | 250/370.08 |

FOREIGN PATENT DOCUMENTS

| | | | |
|---|---|---|---|
| JP | 63-300576 | A * | 5/1987 |
| JP | 2001-074846 | A | 3/2001 |
| JP | 2004-325442 | A | 11/2004 |
| JP | 02011058831 | A * | 3/2011 |

OTHER PUBLICATIONS

Online search Aug. 20, 2011 "Asahi Glass Company (AGC) Develops Worlds Thinnest Sheet Float Glass at Just 0.1MM", Internet <URL:http://www.agc.com/news/2011/0516.pdf>.

* cited by examiner

*Primary Examiner* — David Porta
*Assistant Examiner* — Abra Fein
(74) *Attorney, Agent, or Firm* — SOLARIS Intellectual Property Group, PLLC

(57) ABSTRACT

A photoelectric conversion substrate includes: plural pixels, each provided with a sensor portion and a switching element that are formed on the substrate, the sensor portion including a photoelectric conversion element that generates charge according to illuminated light, and the switching element reading the charge from the sensor portion, a flattening layer that flattens the surface of the substrate having the switching elements and the sensor portions formed thereon, a conducting member formed over the whole face of the flattening layer; and a connection section that connects the conducting member to ground.

18 Claims, 16 Drawing Sheets

PHOTOELECTRIC CONVERSION SUBSTRATE, RADIATION DETECTOR, RADIOGRAPHIC IMAGE CAPTURE DEVICE, AND MANUFACTURING METHOD OF RADIATION DETECTOR

CROSS-REFERENCE TO RELATED APPLICATION

This application claims priority under 35 USC 119 from Japanese Patent Application No. 2011-185238 filed on Aug. 26, 2011, the disclosure of which is incorporated by reference herein.

BACKGROUND OF THE INVENTION

1. Field of the Invention

The present invention relates to a photoelectric conversion substrate, a radiation detector, a radiographic image capture device and a radiation detector manufacturing method, and in particular relates to a photoelectric conversion substrate, a radiation detector, a radiographic image capture device, and a manufacturing method of a radiation detector employed in such applications as radiographic image capture.

2. Description of the Related Art

Radiographic image capture devices for capturing radiographic images are known in which a radiation detector detects radiation that has been irradiated from a radiation irradiation device and has passed through a subject. As the radiation detector of such a radiographic image capture device, detectors are known that are provided with a scintillator such as a fluorescent body that converts irradiated radiation into light, and a photoelectric conversion substrate configured with pixels, each pixel provided with a photoelectric conversion element that generates charge by being illuminated with light converted by the scintillator, and a switching element that reads the charge generated in the photoelectric conversion element.

Since such radiation detectors are provided with a scintillator above the photoelectric conversion substrate, technology is known for improving the adhesion between the photoelectric conversion substrate and the scintillator.

For example, technology is described in Japanese Patent Application Laid-Open (JP-A) No. 2001-74846 for making it more difficult to separate a protection layer for protecting the photoelectric conversion elements and a scintillator from each other by interposing between the protection layer and the scintillator a metallic layer or a metallic compound layer as a separation prevention layer having high thermal conductivity and strong bonding force to the scintillator.

Generally, surface treatment such as plasma processing is performed on the surface of a photoelectric conversion substrate in order to improve adhesion. For example, technology is described in Japanese Patent Application Laid-Open No. 2004-325442 whereby atmospheric pressure plasma processing is performed on the surface of a fluorescent body ground layer disposed above a sensor panel provided with photoelectric conversion elements, preventing delamination resulting from poor adhesion to a fluorescent body layer by forming the fluorescent body layer on the surface of the fluorescent body ground layer.

However, charge that builds up on the surface of the photoelectric conversion element in a case in which surface treatment is performed on the surface of such a photoelectric conversion substrate may cause electrostatic destruction of the photoelectric conversion element. For example, the presence of air when plasma processing is performed at atmospheric pressure as surface treatment makes static buildup less likely to occur, and the risk of causing electrostatic destruction is accordingly low. However, there is a high risk of triggering electrostatic destruction when plasma processing is performed in a vacuum.

Electrostatic destruction may also be triggered when static buildup occurs on the surface of the photoelectric conversion substrate, not only when performing surface treatment.

SUMMARY

The present invention provides a photoelectric conversion substrate, a radiation detector, a radiographic image capture device and a manufacturing method of a radiation detector that can prevent electrostatic destruction of photoelectric conversion elements.

A first aspect of the present invention is a photoelectric conversion substrate including plural pixels, a flattening layer, a conducting member and a connection section. The plural pixels are each provided with a sensor portion and a switching element that are formed on the substrate. The sensor portion includes a photoelectric conversion element that generates charge according to illuminated light, and the switching element reads the charge from the sensor portion. The flattening layer flattens the surface of the substrate having the switching elements and the sensor portions formed thereon. The conducting member is formed over the whole face of the flattening layer. The connection section connects the conducting member to ground.

During manufacture of a radiation detector in which a light emitting layer such as a scintillator is formed on the surface of a photoelectric conversion substrate, generally surface treatment such as plasma processing is performed to the surface of the photoelectric conversion substrate that is going to be adhered to the light emitting layer in order to improve adhesion to the light emitting layer. However, during surface treatment, and in particular during performing plasma processing in vacuum, there may be charge buildup on the surface of the photoelectric conversion substrate as it is being subjected to surface treatment, leading to the accumulation of charge that may trigger electrostatic destruction of elements such as switching elements.

However, the photoelectric conversion substrate of the present exemplary embodiment is provided with the flattening layer that flattens the surface of the substrate provided with the switching elements and the sensor portions, the conducting member formed over the whole face of the flattening layer, and the connection section for connecting the conducting member to ground. Therefore, by connecting the conducting member to ground through the connection section while such surface treatment is being performed, static buildup on the surface of the photoelectric conversion substrate is prevented due to charge accumulated on the surface of the photoelectric conversion substrate flowing to ground. Electrostatic destruction of the photoelectric conversion elements can therefore be prevented. Beside a case in which such surface treatment is being performed, the influence of external noise (such as electromagnetic waves) can also be reduced by connecting the conducting member to ground through the connection section.

The above aspect may be configured such that the conducting member absorbs a predetermined long wavelength component of the illuminated light.

Generally, long wavelength components are not so readily refracted as short wavelength components, and so long wavelength components of oblique light have a higher probability of being incident on an adjacent pixel. Oblique light that is incident on adjacent pixels in this manner may cause blurring in radiographic images. The present invention addresses this issue by absorbing predetermined long wavelength components (for example, red light) of illuminated light with the conducting member, enabling the long wavelength components to be suppressed from being incident onto adjacent pixels.

The above aspect may be configured such that the photoelectric conversion elements include organic photoelectric conversion elements formed with quinacridone.

The above aspect may be configured such that the conducting member has transparency to light.

The above aspect may be configured such that the conducting member is connected to the ground through the connection section.

A second aspect of the present invention is a radiation detector including the photoelectric conversion substrate of the first aspect and a light emitting layer that is formed on the conducting member of the photoelectric conversion substrate and that emits light according to a radiation amount of irradiated radiation.

The above aspect may be configured such that the light emitting layer includes columnar crystals of an alkali halide.

A third aspect of the present invention is a radiographic image capture device including the radiation detector of the second aspect and an image capture section that reads the charge that has been generated in the radiation detector according to the irradiated radiation and captures a radiographic image.

A fourth aspect of the present invention is a method of manufacturing a radiation detector including connecting the conducting member of the photoelectric conversion substrate of claim 1 to ground via the connection section, performing surface treatment on the surface of the photoelectric conversion substrate on which the conducting member is formed while the conducting member is connected to ground, and forming a light emitting layer on the conducting member on which the surface treatment has been performed.

The above aspect may be configured such that the forming of the light emitting layer is performed while the conducting member is connected to ground.

The above aspect may be configured such that the light emitting layer is formed by vapor deposition of the light emitting layer on the photoelectric conversion substrate.

The present invention can accordingly prevent electrostatic destruction of the photoelectric conversion elements.

BRIEF DESCRIPTION OF THE DRAWINGS

An exemplary embodiment of the present invention will be described in detail based on the following figures, wherein.

DETAILED DESCRIPTION

Figure 1:
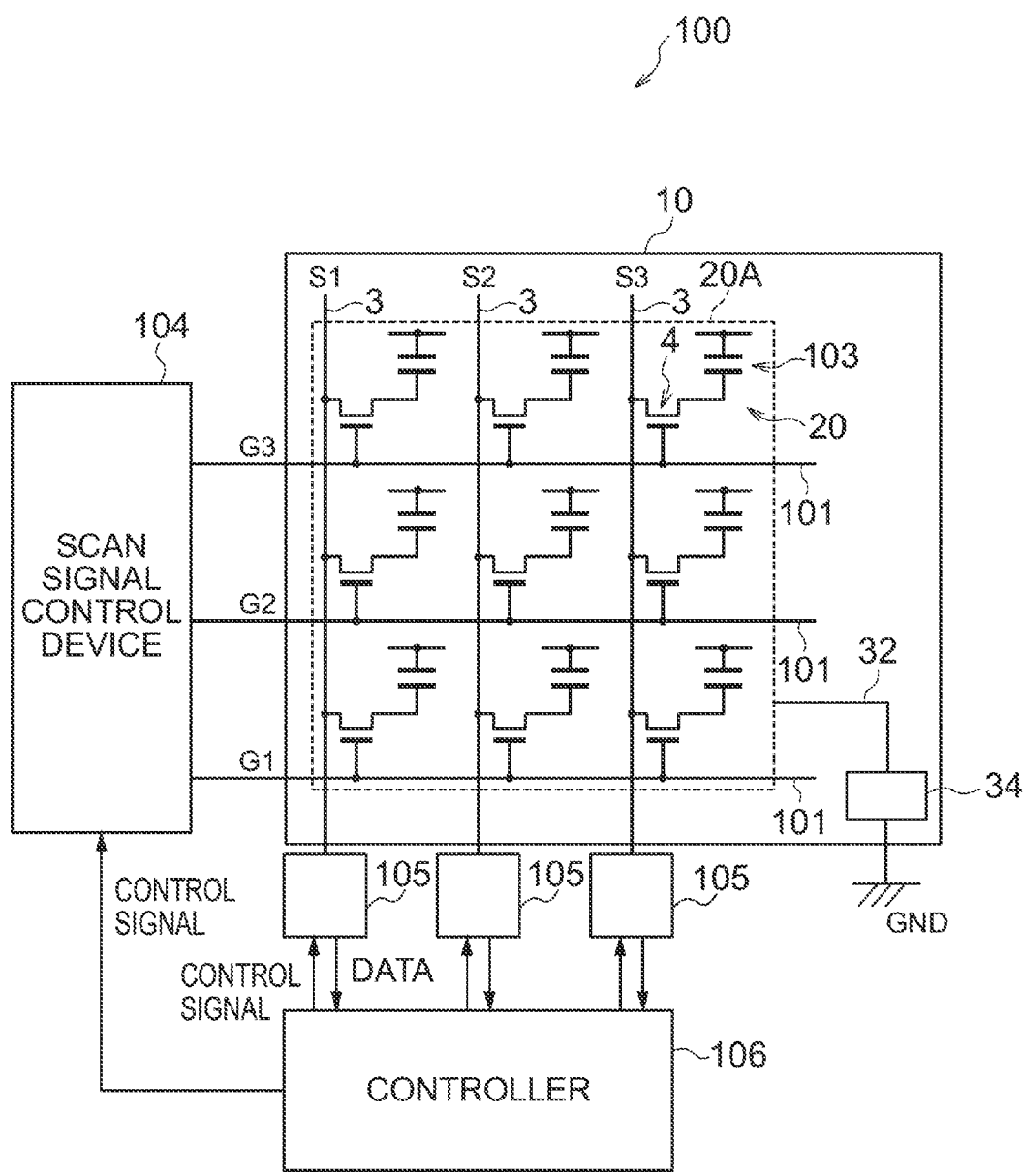
FIG. 1 is a configuration diagram illustrating an example of an overall configuration of a radiographic image capture device according to the present exemplary embodiment.

Outline explanation is given of a radiographic image capture device employing a radiation detector provided with a photoelectric conversion substrate of the present exemplary embodiment. FIG. 1 is a drawing illustrating an example of an overall configuration of a radiographic image capture device employing a radiation detector provided with a photoelectric conversion substrate of the present exemplary embodiment. Note that illustration of a scintillator 70 (described in detail later) has been omitted from in FIG. 1.

A radiographic image capture device 100 according to the present exemplary embodiment is provided with an indirect-conversion method radiation detector 10, a scan signal control device 104, signal detection circuits 105, and a controller 106. The radiation detector 10 of the present exemplary embodiment is provided with a photoelectric conversion substrate 60 and a scintillator 70.

Figure 2:
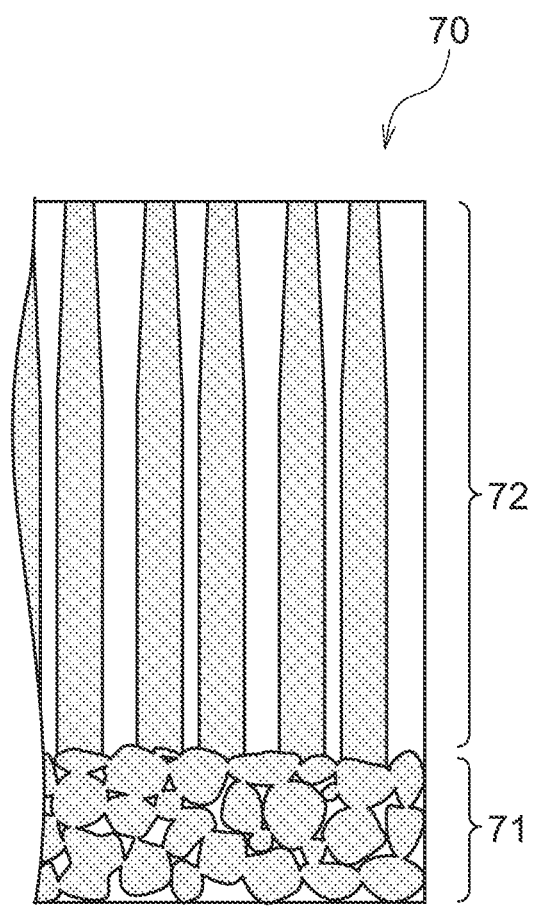
FIG. 2 is a schematic configuration diagram illustrating an example of a scintillator according to the present exemplary embodiment.

Explanation is first given regarding the scintillator 70. An example of an outline configuration of the scintillator 70 of the present exemplary embodiment is illustrated in FIG. 2. The scintillator 70 converts irradiated radiation into light, and emits the light. Namely, the scintillator 70 of the present exemplary embodiment emits light according to the amount of irradiated radiation.

The scintillator 70 may for example employ crystals formed from CsI (T1), GOS ($Gd_2O_2S$:Tb), NaI:T1 (thallium-activated sodium iodide), CsI:Na (sodium-activated cesium iodide), however the scintillator 70 is not limited to one formed from these materials. Note that out of these materials, it is preferable to employ CsI(T1) from the perspective of being a material having light emission spectrum matching the maximum spectral sensitivity value of an a-Si photodiode (in the region of 550 nm) and being a material not liable to degrade from moisture over time.

It is also preferable for the wavelength region of light emitted by the scintillator 70 to be in the visible light region (wavelengths of 360 nm to 830 nm), and it is even more preferable to be in a wavelength region including green wavelength range (495 nm to 570 nm) in order to allow monochrome image capture by the radiographic image capture device 100.

As a specific fluorescent body employed in the scintillator 70, a fluorescent body including cesium iodide (CsI) is preferably employed in a case in which X-rays are employed as radiation for image capture, and it is particularly preferable, for example, to employ CsI(T1) with a light emitting spectrum of 400 nm to 700 nm when being irradiated by X-ray. Note that there is the emission peak wavelength of CsI (T1) in the visible light region at 565 nm.

From the perspective of light emission efficiency the scintillator 70 may be configured from columnar crystals, and in particular alkali halide columnar crystals. As a specific example, in the present exemplary embodiment, the scintillator 70 employed is configured with CsI (T1) columnar crystals. The scintillator 70 of the present exemplary embodiment illustrated in FIG. 2 is configured from a non-columnar portion 71 formed from non-columnar CsI (T1) crystals, and a columnar portion 72 formed from columnar crystals. Note that the non-columnar portion 71 side of the scintillator 70 is in contact with the photoelectric conversion substrate 60 side (see FIG. 4 and FIG. 5).

Light is generated in each columnar crystal in the columnar portion 72 so as to obtain efficient light emission. The gaps between the columnar crystals also act as light guides and suppress blurring of radiographic images by suppressing light diffusion. Light that has penetrated into the deep portion of the scintillator 70 is reflected by the non-columnar portion 71 formed from non-columnar crystals, thereby improving the detection efficiency of emitted light, and improving the adhesion of the scintillator 70 to the photoelectric conversion substrate 60. As shown in FIG. 2, if the thickness of the columnar portion 72 of the scintillator 70 is denoted t1, and the thickness of the non-columnar portion 71 is denoted t2, then the relationship of t1 and t2 can be made to satisfy the Formula (1) below.

$$0.01 \leq (t2/t1) \leq 0.25 \quad \text{Formula (1)}$$

By setting the thickness t1 of the columnar portion 72 and the thickness t2 of the non-columnar portion 71 so as to satisfy Formula (1), the light emission efficiency along thickness direction of the scintillator 70, light diffusion prevention and the region of light reflection fall in a preferable region, and light emitting efficiency, light detection efficiency and image resolution are further improved. If the thickness t2 of the non-columnar portion 71 is too thick, the region of poor light emission efficiency increases, leading to concerns regarding decreased sensitivity. It is more preferable for (t2/t1) to be in a range of 0.02 to 0.1 from such a perspective.

From the perspective of achieving efficient reflection, the crystal size of the non-columnar crystals in the non-columnar portion 71 is preferably 0.2 µm to 7.0 µm, and more preferably 1.0 µm to 6.0 µm. From the perspective of achieving efficient reflection, the shape of the non-columnar crystals may be a substantially spherical shape, and the non-columnar portion 71 may be configured as an aggregate body of near-spherical crystals (substantially spherical crystals).

Explanation follows of the photoelectric conversion substrate 60 of the present exemplary embodiment. As shown in FIG. 1, the photoelectric conversion substrate 60 of the present exemplary embodiment is disposed with plural pixels 20 in a two-dimensional formation (matrix formation). Each of the pixels 20 includes a sensor portion 103 provided with an upper electrode, a semiconductor layer and a lower electrode, described later, receiving light that has been converted by the scintillator 70 from irradiated radiation, and accumulating charge; and a TFT switch 4 that reads charge accumulated in the sensor portion 103.

Plural of the pixels 20 are disposed in a matrix formation along a direction (the direction along scan lines 101 in FIG. 1) and a direction intersecting with the direction along scan lines 101 (the direction along signal lines 3 in FIG. 1). The array of the pixels 20 is simplified in the illustration of FIG. 1. In reality there are, for example, 1024×1024 individual pixels 20 disposed along the direction along scan lines 101 and along the direction along signal lines 3. The region of the photoelectric conversion substrate 60 formed with the pixels 20 is referred to below as the pixel region 20A.

The scan lines 101 and the signal lines 3 are plurally disposed on the photoelectric conversion substrate 60 so as to intersect with each other. The scan lines 101 switch the TFT switches 4 ON or OFF. The signal lines 3 read charge accumulated in the sensor portions 103.

An electrical signal, corresponding to the amount of accumulated charge in the sensor portion 103, flows in each of the signal lines 3 by switching ON the TFT switch 4 in any of the pixels 20 connected to this signal line 3. A signal detection circuit 105 is connected to each of the signal lines 3 for detecting the electrical signal flowing out from each of the signal lines 3. A scan signal control device 104 is also connected to the scan lines 101 for outputting a scan signal to each of the scan lines 101 for ON/OFF switching of the TFT switches 4.

The signal detection circuits 105 are each inbuilt with an amplifier circuit (not shown in the drawings) for each of the respective signal lines 3, and the amplifier circuits amplify input electrical signals. Electrical signals input by each of the signal lines 3 are amplified by the amplifier circuits and detected in the signal detection circuit 105. The signal detection circuits 105 thereby detect the charge amount that has been accumulated in each of the sensor portions 103 as data for each pixel 20 configuring a radiographic image. Note that "detection" of the electrical signals refers here to sampling the electrical signals.

A controller 106 is connected to the signal detection circuits 105 and the scan signal control circuit 104. The controller 106 executes specific processing on the electrical signals detected by the signal detection circuits 105. The controller 106 also outputs a control signal expressing the timing of signal detection to the signal detection circuits 105, and outputs a control signal expressing the timing for scan signal output to the scan signal control device 104.

Figure 3:
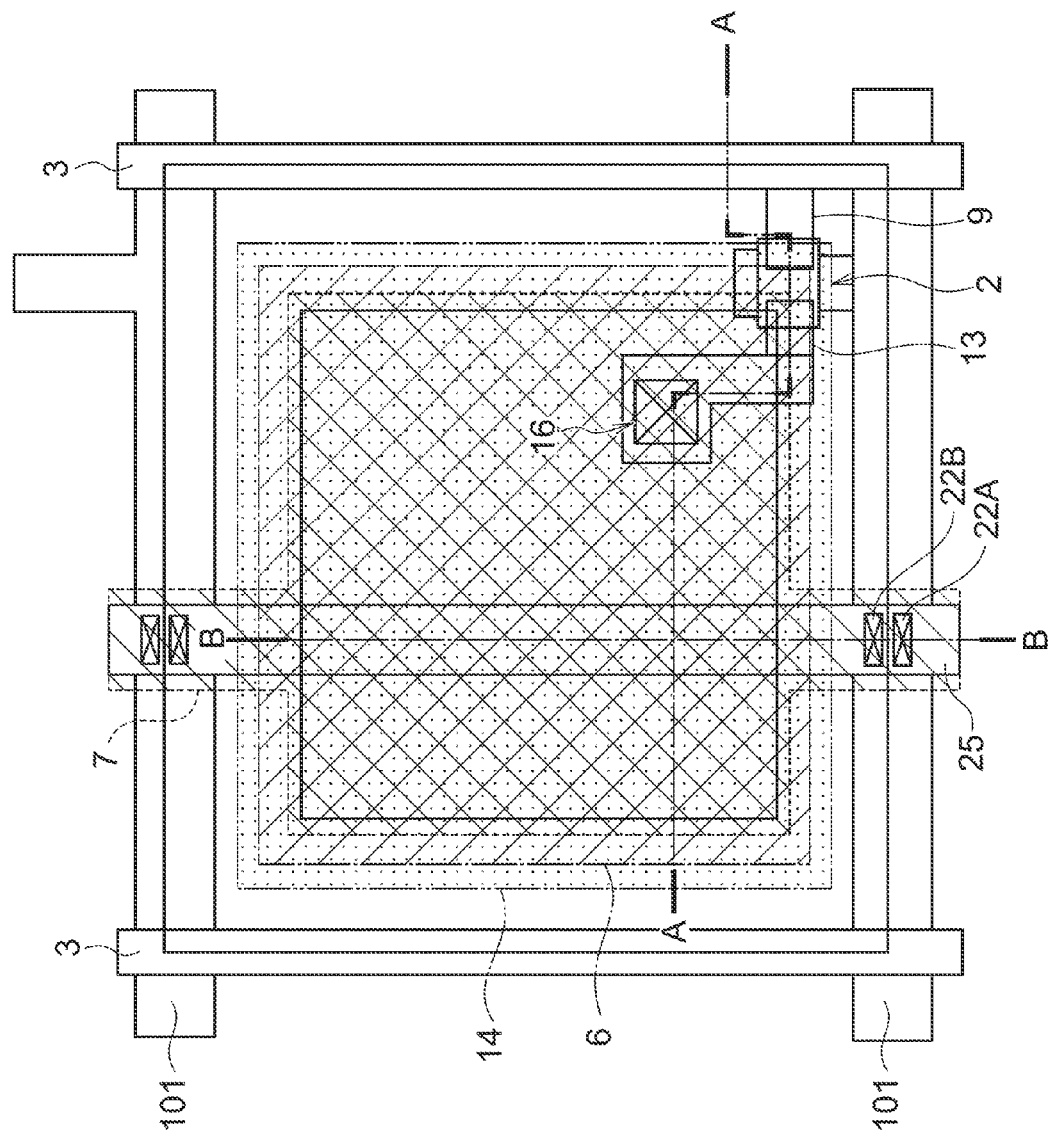
FIG. 3 is a plan view illustrating an example of a structure of a single pixel unit of a radiation detector on a photoelectric conversion substrate of the present exemplary embodiment.
Figure 4:
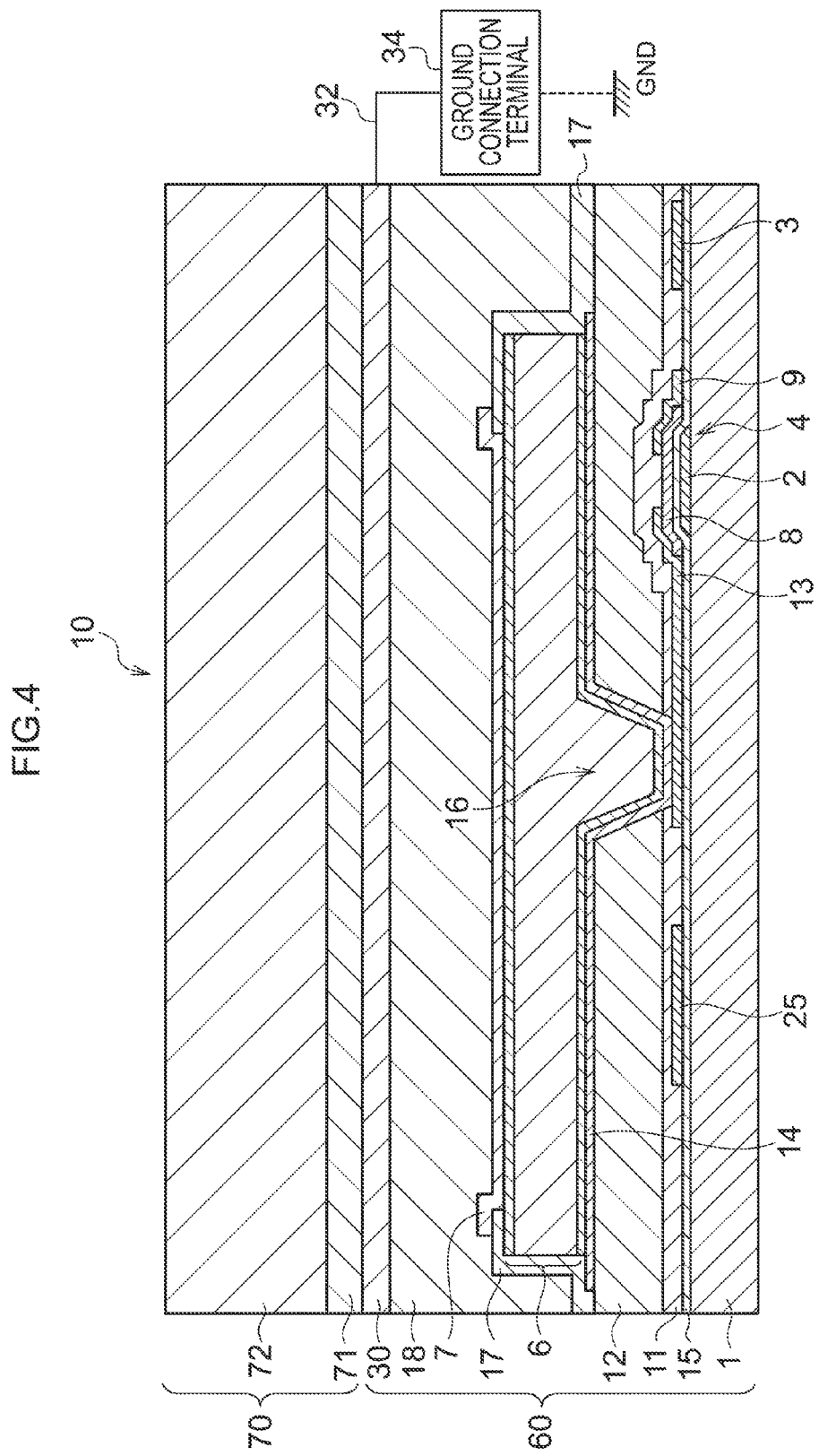
FIG. 4 is a cross-section of the radiation detector illustrated in FIG. 3, taken along line A-A.
Figure 5:
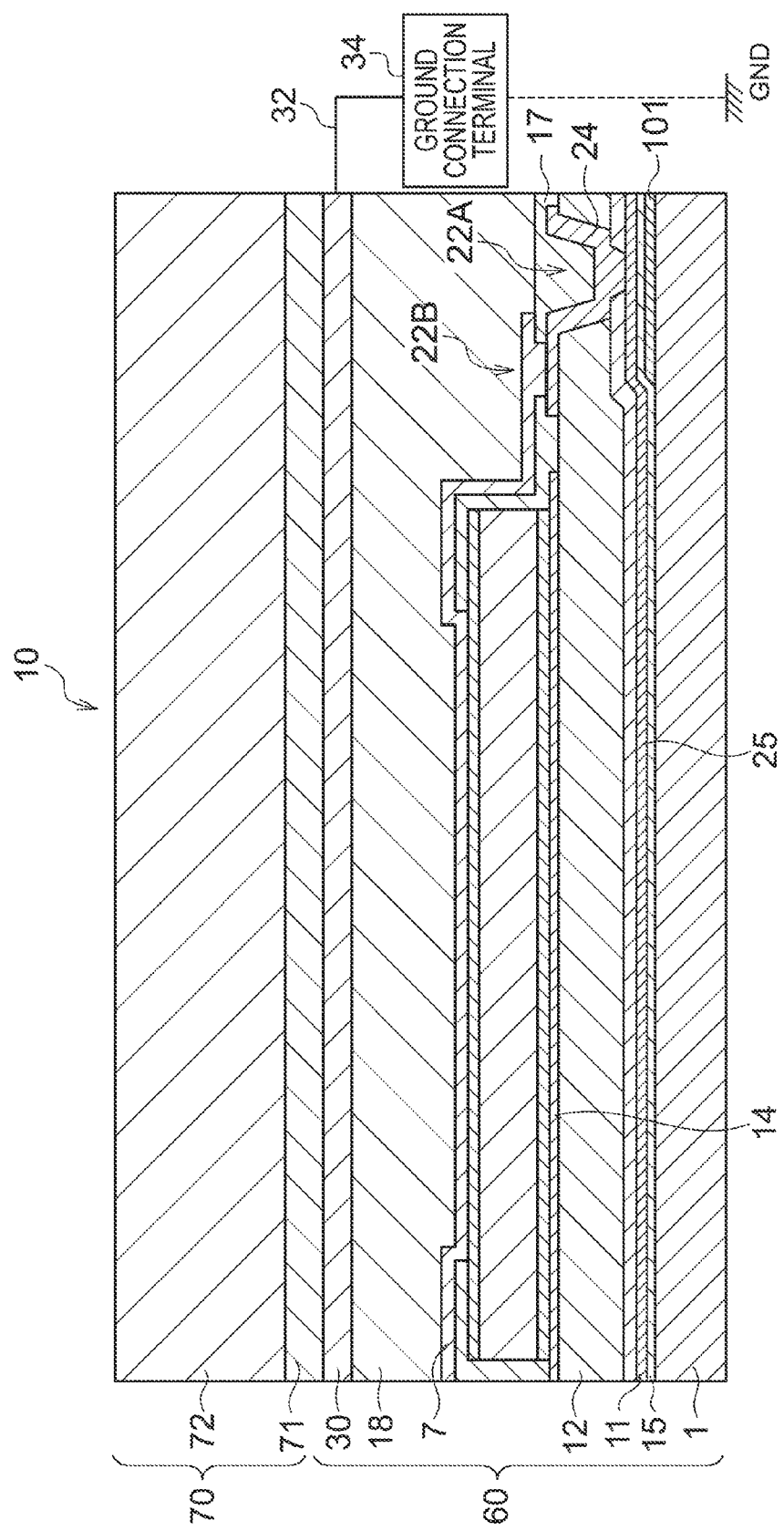
FIG. 5 is a cross-section of the radiation detector illustrated in FIG. 3, taken along line B-B.

More detailed explanation now follows regarding the photoelectric conversion substrate 60 according to the present exemplary embodiment, with reference to FIG. 3 to FIG. 5. Note that FIG. 3 shows a plan view illustrating a structure of a single pixel unit of a radiation detector on the photoelectric conversion substrate 60 according to the present exemplary embodiment. FIG. 4 shows a cross-section taken along the line A-A of FIG. 3 (shows a cross-section taken along the bent line A-A as stretched out into a flat plane). FIG. 5 shows a cross-section taken along the line B-B of FIG. 3.

As shown in FIG. 4 and FIG. 5, the radiation detector 10 of the present exemplary embodiment is formed with an insulating substrate 1 configured from a material such as non-alkali glass, on which the scan lines 101, and gate electrodes 2 are formed. The scan lines 101 and the gate electrodes 2 are connected together (see FIG. 3). The wiring layer in which the scan lines 101 and the gate electrodes 2 are formed (this wiring layer is referred to below as "the first signal wiring layer") is formed from Al or Cu, or a layered film mainly composed of Al or Cu. However, the material of the first signal wiring layer is not limited thereto.

An insulation film 15 is formed on the scan lines 101 and the gate electrodes 2 on one face so as to cover the scan lines 101 and the gate electrodes 2. The locations of the insulation film 15 positioned over the gate electrodes 2 are employed as a gate insulation film in the TFT switches 4. The insulation film 15 is, for example, formed from a material such as $SiN_x$ by, for example, Chemical Vapor Deposition (CVD) film forming.

A semiconductor active layer 8 is formed with an island shape on the insulation film 15 above each of the gate electrodes 2. The semiconductor active layer 8 is a channel portion of the TFT switch 4 and is, for example, formed from an amorphous silicon film.

A source electrode 9 and a drain electrode 13 are formed in a layer above these. The wiring layer in which the source electrode 9 and the drain electrode 13 are formed also has the signal line 3 and the common electrode line 25 running parallel to the signal line 3 formed therein. The source electrode 9 is connected to the signal line 3. The wiring layer in which the signal lines 3, the source electrodes 9 and the common electrode lines 25 are formed (this wiring layer is referred to below as "the second signal wiring layer") is formed from Al or Cu, or a layered film mainly composed of Al or Cu. However, the material of the second signal wiring layer is not limited thereto.

A contact layer (not shown in the drawings) is formed between the semiconductor active layer 8 and both the source electrode 9 and the drain electrode 13. The contact layer is an impurity doped semiconductor of, for example, impurity doped amorphous silicon or the like. Each of the TFT switches 4 is configured with such a configuration.

A TFT protection layer 11 is formed over substantially the whole surface (substantially all regions) of the pixel region 20A where the pixels 20 are situated above the substrate 1 so as to cover the semiconductor active layer 8, the source electrodes 9, the drain electrodes 13, the signal lines 3 and the common electrode lines 25. The TFT protection layer 11 is formed, for example, from a material such as $SiN_x$ by, for example, CVD film forming.

A coated intermediate insulation film 12 is formed on the TFT protection layer 11. The intermediate insulation film 12 is formed from a low permittivity (relative permittivity $\epsilon r=2$ to 4) photosensitive organic material (examples of such materials include positive-working photosensitive acrylic resin materials with a base polymer formed by copolymerizing methacrylic acid and glycidyl methacrylate, mixed with a naphthoquinone diazide positive-working photosensitive agent) at a film thickness of 1 to 4 µm. In the radiation detector 10 according to the present exemplary embodiment, intermetal capacitance between metal disposed in the layers above the intermediate insulation film 12 and below the intermediate insulation film 12 is suppressed to a small capacitance by the intermediate insulation film 12. Generally such materials also function as a flattening film, exhibiting an effect of flattening out steps in the layers below. A reduction in absorption efficiency and an increase in leak current due to unevenness of the semiconductor layer 6 can thereby be suppressed since the profile is flattened for the semiconductor layer 6 disposed above the intermediate insulation film 12. A contact hole 16 and a contact hole 22A are formed in the intermediate insulation film 12 and the TFT protection layer 11 at, respectively, positions facing each of the drain electrodes 13 and positions on the irradiated face side of the region where each of the scan lines 101 is formed.

A lower electrode 14 of each of the sensor portions 103 is formed on the intermediate insulation film 12 so as to cover the pixel region 20A while also filling the contact hole 16. The lower electrode 14 is connected to the drain electrode 13 of the TFT switch 4. If the thickness of the semiconductor layer 6, described later, is about 1 µm there are substantially no limitations to the material of the lower electrode 14, as long as it is an electrically conductive material. The lower electrode 14 may therefore be formed using a conductive metal such as an aluminum material or indium tin oxide (ITO).

However, there is insufficient light absorption in the semiconductor layer 6 if the film thickness of the semiconductor layer 6 is thin (about 0.2 to 0.5 µm). An alloy or layered film with a main component of a light blocking metal may be employed for the lower electrode 14 in order to prevent an increase in leak current occurring due to light illumination onto the TFT switch 4.

The semiconductor layer 6 is formed on the lower electrode 14 and functions as a photodiode (a photoelectric conversion element). In the present exemplary embodiment, a photodiode of PIN structure is employed as the semiconductor layer 6. The semiconductor layer 6 is formed from the bottom with an $n^+$ layer, an i layer and a $p^+$ layer stacked on each other in order.

The semiconductor layer 6 may be configured with an organic photoelectric conversion element. It is preferable for such an organic photoelectric conversion element to have an absorption peak wavelength as close as possible to the emission peak wavelength of the scintillator 70 in order to most efficiently absorb light emitted by the scintillator 70. While ideally the absorption peak wavelength of the organic photoelectric conversion material matches the emission peak wavelength of the scintillator 70, it is possible to achieve sufficient absorption of light emitted from the scintillator 70 as long as there is a small difference between the two peak wavelengths. More specifically, the difference between the absorption peak wavelength of the organic photoelectric conversion material and the emission peak wavelength to radiation of the scintillator 70 is preferably 10 nm or smaller, and is more preferably 5 nm or smaller.

Figure 6:
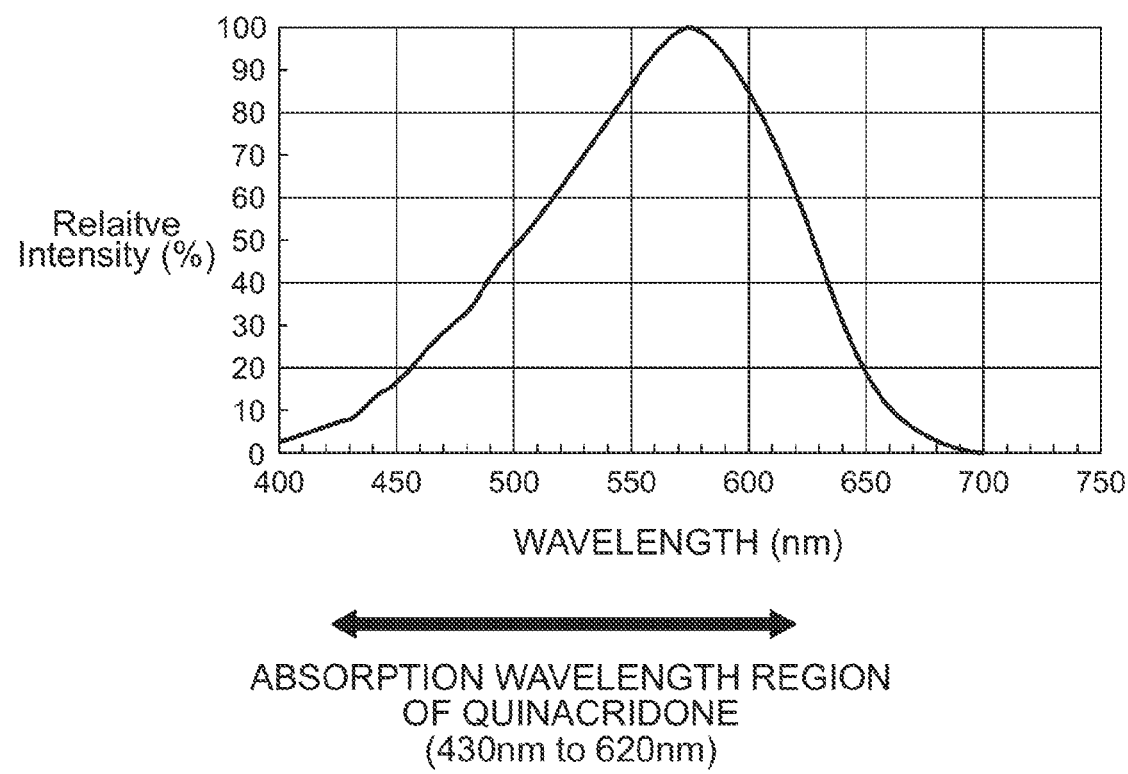
FIG. 6 is a graph illustrating the light emission property of CsI (T1) and the absorption wavelength range of quinacridone.

Examples of organic photoelectric conversion materials capable of satisfying such conditions include, for example, quinacridone organic compounds and phthalocyanine organic compounds. As shown in FIG. 6, CsI (T1) has an emission peak wavelength at 565 nm, and emits light including wavelengths over a wide wavelength region (400 nm to 700 nm). However, quinacridone is sensitive to light in the wavelength region 430 nm to 620 nm. Since the absorption peak wavelength in the visible region for quinacridone is at 560 nm, it is therefore possible to achieve a principle wavelength difference of 5 nm or smaller in a case in which quinacridone is employed as the organic photoelectric conversion material and CsI (T1) is employed as the material for the scintillator 70. The charge amount generated in the semiconductor layer 6 can accordingly be made substantially as large as possible. The semiconductor layer 6 therefore preferably employs an organic photoelectric conversion material formed with quinacridone.

In the present exemplary embodiment the lower electrode 14 is made larger than the semiconductor layer 6. Note that in a case in which the thickness of the semiconductor layer 6 is thin (for example 0.5 µm or less) a light blocking metal may be additionally disposed so as to cover each of the TFT switches 4 in order to prevent light from being incident to the TFT switch 4.

A separation of 5 μm or greater is preferably secured between the edge portions of the lower electrodes 14 made from a light blocking metal and the channel portions of the TFT switches 4 in order to suppress light arising from light scattering and reflection within the device from being incident to the TFT switches 4.

A protection insulation film 17 is formed on the intermediate insulation film 12 and the semiconductor layer 6. The protection insulation film 17 is provided with apertures at each portion where the semiconductor layers 6 are disposed. Upper electrodes 7 are formed on the semiconductor layer 6 and the protection insulation film 17 so as to at least cover each of the apertures in the protection insulation film 17. A material with high light-transparency such as ITO or Indium Zinc Oxide (IZO) is employed for example for the upper electrodes 7. In the present exemplary embodiment, each of the upper electrodes 7 also functions as a conducting member for connection to the respective common electrode line 25 disposed in a lower layer for supplying a bias voltage to the upper electrode 7. As shown in FIG. 5, each of the common electrode lines 25 is connected through the contact hole 22A provided in the intermediate insulation film 12 to a contact pad 24 formed in the lower electrode 14 layer. Each of the upper electrodes 7 is also electrically connected to the respective common electrode line 25 due to the upper electrode 7 covering over the contact hole 22B provided in the protection insulation film 17. Configuration may be made such that the upper electrode 7 and the conducting member for connecting the upper electrode 7 to the common electrode lines 25 are formed from metal in different layers to each other.

A flattening layer 18 for surface flattening is formed over the upper electrode 7 and the protection insulation film 17. The flattening layer 18 is an insulating layer formed, for example, from a material such as $SiN_x$ with a thickness of 1 μm to 10 μm. The conduction film 30 (conducting member) is formed on the flattened flattening layer 18. The conduction film 30 in the present exemplary embodiment prevents static buildup. In particular, the conduction film 30 prevents static buildup on the surface of the photoelectric conversion substrate 60 (the conduction film 30) by connecting the conduction film 30 to ground in a case such as performing surface treatment to the surface of the photoelectric conversion substrate 60 (the conduction film 30) for forming the scintillator 70 on the photoelectric conversion substrate 60. In a case in which static buildup occurs on the surface of the photoelectric conversion substrate 60 (the conduction film 30), electrostatic destruction may occur to the sensor portions 103 of the photoelectric conversion substrate 60. Therefore the conduction film 30 in the present exemplary embodiment is formed over the whole face of the flattening layer 18 (or over substantially the whole face), and is formed over the whole face of the pixel region 20A in the present exemplary embodiment. In concrete terms, the conduction film 30 at least covers the portion of the flattening layer 18, on which the scintillator 70 is to be formed. Further, the conduction film 30 may cover terminals (not illustrated in the drawings) on the photoelectric conversion substrate 60 that are provided to connect the signal lines 3 to the signal detection circuits 105, in order to prevent static build up on the terminals when the scintillator 70 is formed. In this regard, the terminals should ultimately be configured without being covered by the conduction film 30. Therefore, the conduction film 30 should be formed so that the portion of the conduction film 30 covering the terminals can be removed after forming the scintillator 70. Examples of substances which may be employed for the conduction film 30 include ITO and organic conductive polymer films. The film thickness and resistance of the conduction film 30 are determined from the perspective of static buildup prevention. Specific examples thereof include a film thickness of several tens to several hundreds of nm and a resistance of $10^{10}$ Ω or lower.

In order to prevent such static buildup, the conduction film 30 of the present exemplary embodiment is connected to a ground connection terminal 34 through a ground line 32. The ground connection terminal 34 is employed for ground connection. Note that the shape and configuration of the ground connection terminal 34 are not particularly limited, and may be configured as for example a pad or an electrode as long as the ground connection terminal 34 has functionality for connecting the ground line 32 to ground. The ground connection terminal 34 of the present exemplary embodiment is provided externally to the pixel region 20A and in a region of an end portion of the substrate 1. Note that in the present exemplary embodiment the ground line 32 and the ground connection terminal 34 are integrally formed together with the conduction film 30.

Figure 7:
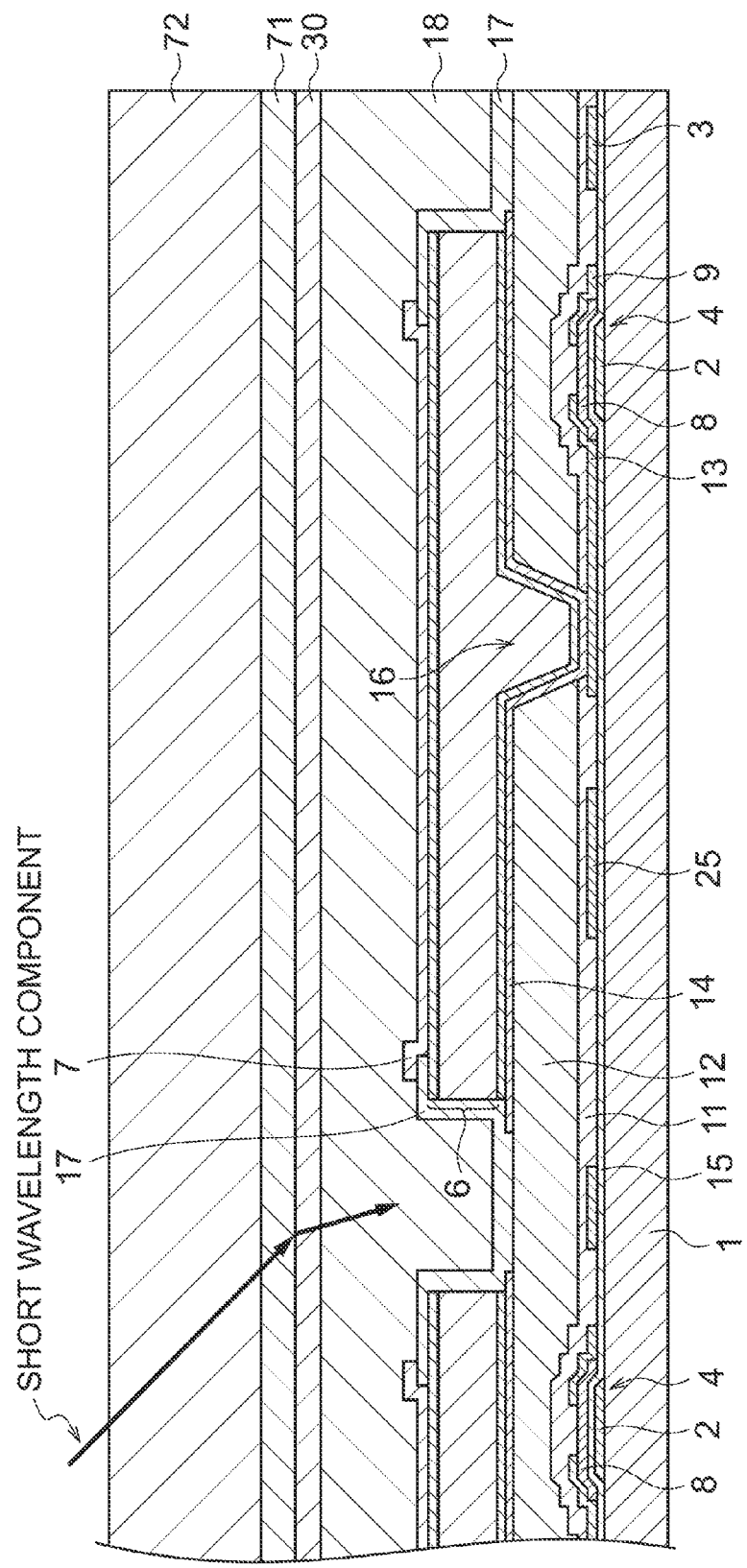
FIG. 7 is an explanatory diagram related to short wavelength components incident to a radiation detector according to the present exemplary embodiment.
Figure 8:
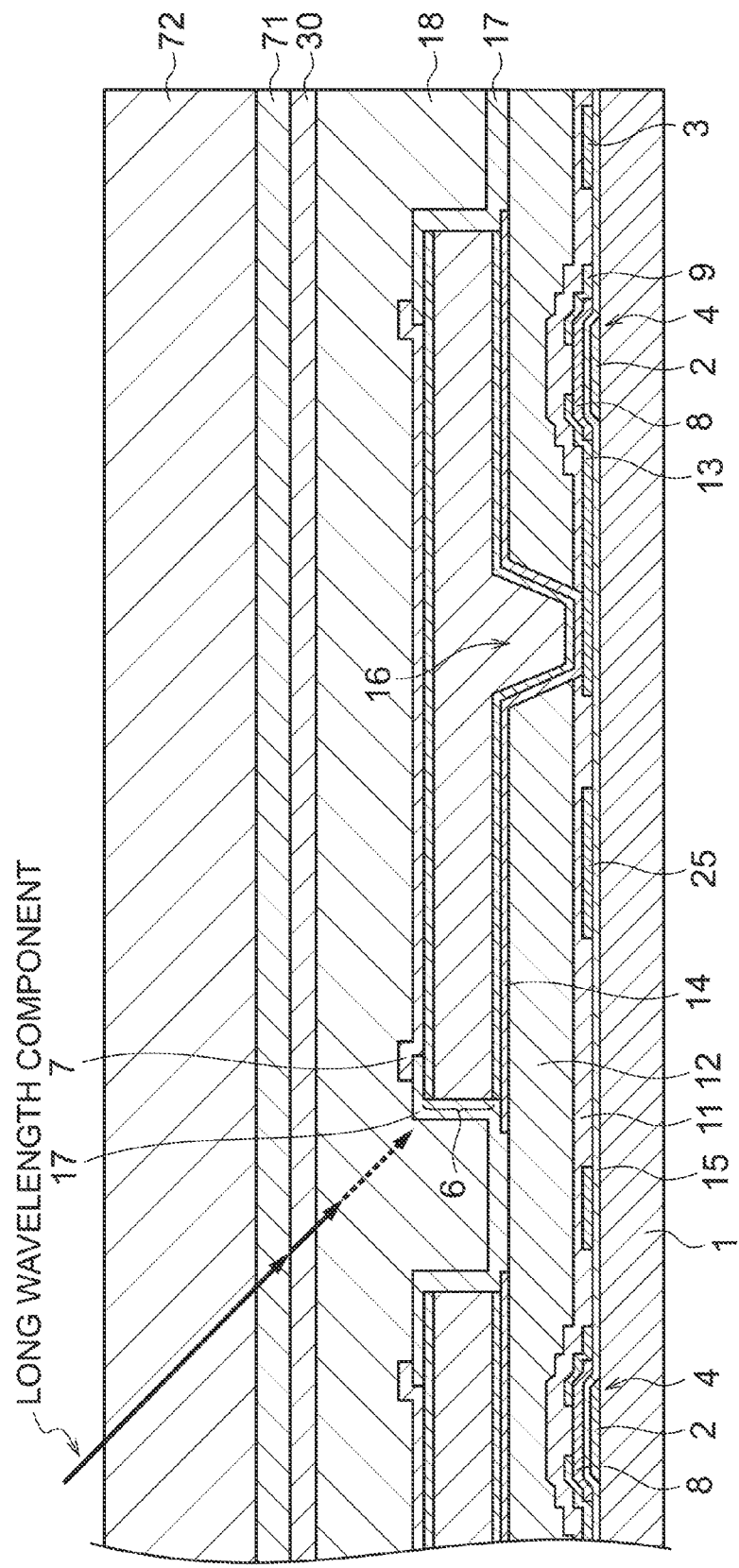
FIG. 8 is an explanatory diagram related to long wavelength components incident to a radiation detector according to the present exemplary embodiment.

The conduction film 30 in the present exemplary embodiment also absorbs some long wavelength components of the emission wavelengths of the scintillator 70. Adjacent pixels 20 readily receive light if oblique light is incident to the photoelectric conversion substrate 60 (the conduction film 30). As shown in FIG. 7, short wavelength components (for example blue light and green light) are readily refracted and are not received by the sensor portions 103 of the adjacent pixels 20. However, long wavelength components (for example red light) are less readily refracted and so more readily received by the sensor portions 103 of the adjacent pixels 20, as shown in FIG. 8. Blurring of images therefore may occur.

Figure 9:
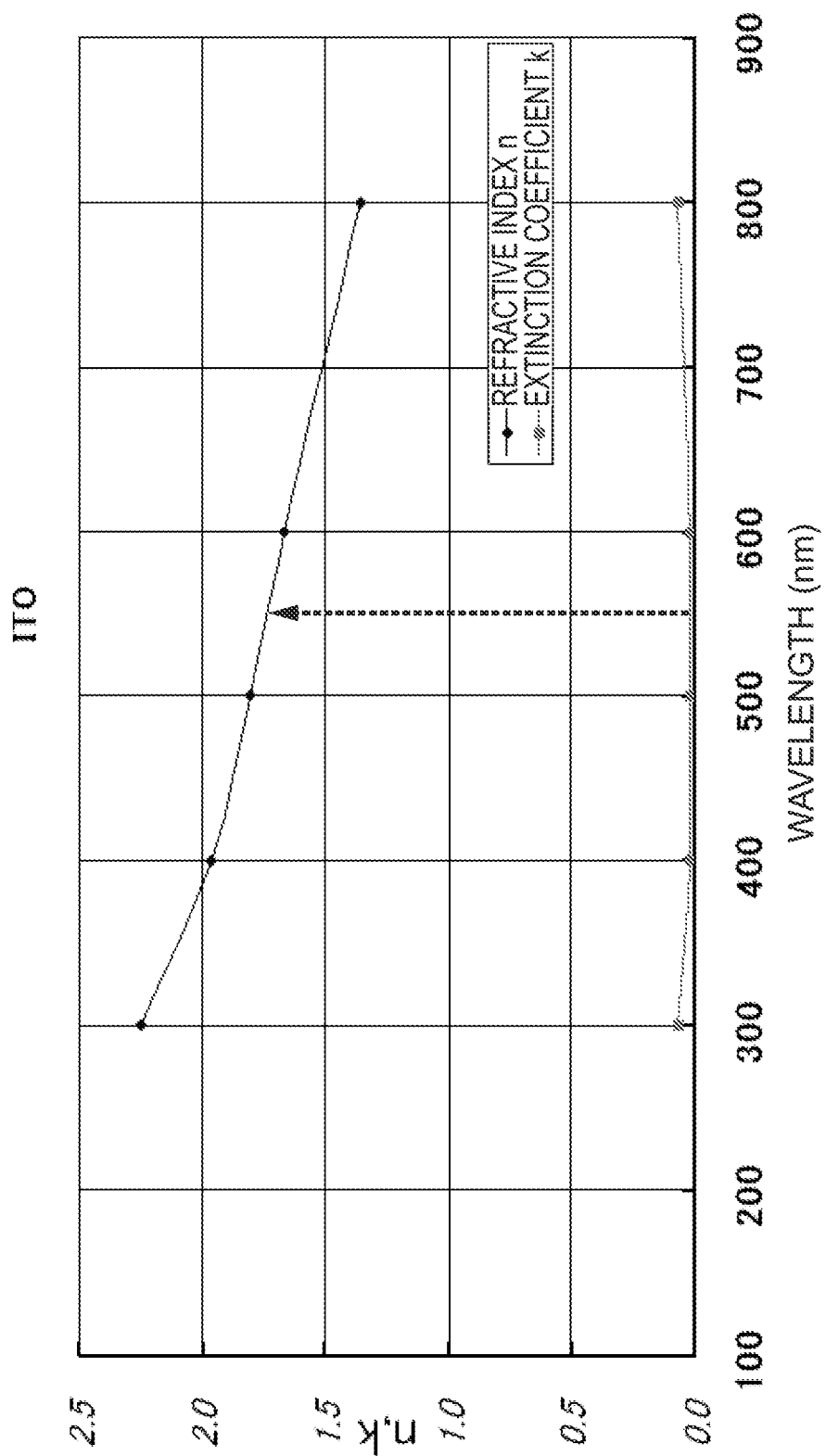
FIG. 9 is a graph illustrating the refractive index of ITO.

FIG. 9 illustrates the refractive index of ITO that serves as a specific example of the conduction film 30. In a specific example of the scintillator 70 employing CsI, the refractive index of ITO in the emission wavelength region of CsI does not substantially differ from the refractive index of CsI (1.77). The emission peak wavelength of CsI is 550 nm, and since the refractive index of ITO for this wavelength is about 1.75, the refractive indexes can be treated as being substantially the same. Consequently, in the emission peak wavelength region even oblique incident light moves forward without refraction occurring due to differences in material. The conduction film 30 of the present exemplary embodiment cuts off long wavelength components from such oblique incident light. In order to achieve this, a colorant for cutting off the long wavelength components is mixed into the conduction film 30 of the present exemplary embodiment. As a specific example, a cyan colorant may be mixed into the conduction film 30 to cut off long wavelength components outside the quinacridone absorption wavelength region shown in FIG. 6 (red light: wavelengths 620 nm to 750 nm). Examples of inorganic blue colorants that may be employed therefor include ultramarine blue and Prussian blue (potassium ferrocyanide). Examples of organic blue colorants that may be employed therefore include phthalocyanine, anthraquinone, indigoid and carbonium. Organic colorants are preferably employed in a case in which the radiation detector 10 is employed with Irradiation Side Sampling (ISS) method in order for more of the radiation to be allowed to reach the scintillator 70, since inorganic colorants more readily absorb radiation than organic colorants due to containing elements with larger atomic numbers.

Note that it is preferable to absorb as much red light as possible. Since oblique incident light is readily received by adjacent pixels 20 in a case in which the size of the pixels 20 is small (for example 100 μm or less), the amount of colorant mixed in may be increased in such cases so as to raise the absorptance of red light. The amount of colorant contained in the conduction film 30 may therefore be determined according to such factors as the size of the pixels 20.

Examples of colorant include pigments and dyes. Pigments are present as particles in a resin, whereas dyes are present fused with a resin. Note that the colorants mentioned above may also be mixed into the flattening layer 18 in order to cut off even more of the long wavelength components.

Explanation now follows regarding an example of a manufacturing process of a radiation detector 10 according to the present exemplary embodiment.

Figure 10:
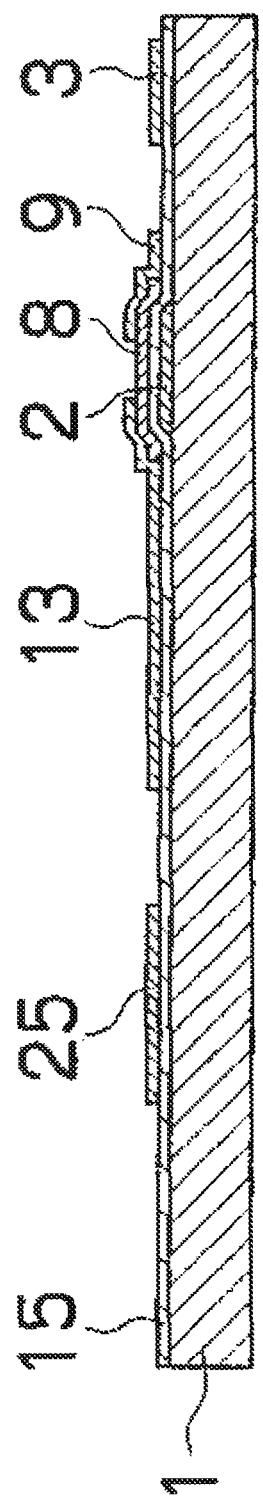
FIG. 10 is an explanatory diagram (cross-section) explaining a manufacturing process of a radiation detector according to the present exemplary embodiment.

First, as shown in FIG. 10, the gate electrodes 2 and the scan lines 101 (omitted in FIG. 10) are formed as the first signal wiring layer on the substrate 1. The first signal wiring layer is formed from a low resistance metal such as Al or an Al alloy, or formed from stacked barrier metal layers formed from a high melting point metal, deposited on the substrate 1 using a sputtering method with a film thickness of about 100 nm to 300 nm. Patterning of a resist film is then performed using photolithographic technology. Then the metal film is patterned using a wet etching method or a dry etching method with an Al etchant. The first signal wiring layer is completed by removing the resist. Then the insulation film 15, the semiconductor active layer 8 and a contact layer (not shown in the drawings) are deposited in sequence on the first signal wiring layer. The insulation film 15 is formed from SiNx with a film thickness of 200 nm to 600 nm, the semiconductor active layer 8 is formed from amorphous silicon with a film thickness of about 20 nm to 200 nm, and the contact layer is formed from impurity doped amorphous silicon with a film thickness of about 10 nm to 100 nm by deposition using a Plasma-Chemical Vapor Deposition (P-CVD) method. Then, similarly to with the first signal wiring layer, patterning of a resist is performed using photolithographic technology. The semiconductor active regions are then formed by selectively dry etching the semiconductor active layer 8 and the contact layer formed from an impurity doped semiconductor down to the insulation film 15. The signal lines 3, the source electrodes 9, the drain electrodes 13, and the common electrode lines 25 are then formed as the second signal wiring layer as a layer above the insulation film 15 and the semiconductor active layer 8. The second signal wiring layer is, similarly to the first signal wiring layer, formed with a film thickness of about 100 nm to 300 nm from a low resistance metal such as Al, an Al alloy, or formed from stacked barrier metal layers formed from a high melting point metal, or formed from a single layer of high melting point metal such as Mo. Similarly to with the first signal wiring layer, patterning of a resist film is then performed using photolithographic technology, and the metal film is then patterned using a wet etching method or a dry etching method with an Al etchant. The insulation film 15 is not removed when this is performed by selectively employing an etching method. The contact layer and a portion of the semiconductor active layer 8 are then removed by further dry etching to form a channel region.

Figure 11:
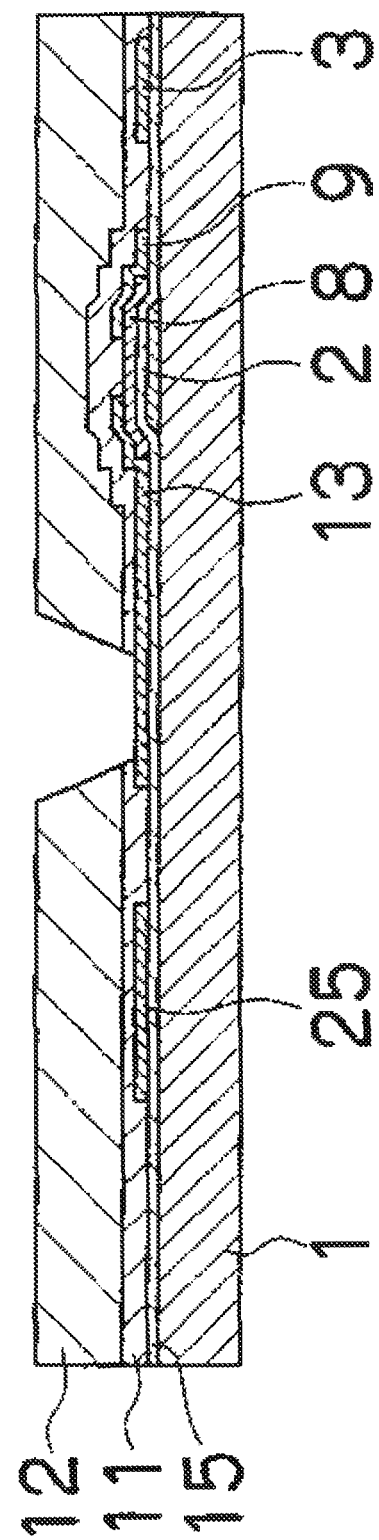
FIG. 11 is an explanatory drawing (cross-section) explaining a process following the process illustrated in FIG. 10 in the manufacturing processes of a radiation detector according to the present exemplary embodiment.

Then, as shown in FIG. 11, the TFT protection layer 11 and the intermediate insulation film 12 are formed in sequence above the layers formed as described above. There are cases in which the TFT protection layer 11 and the intermediate insulation film 12 are formed with a single inorganic material, cases in which they are formed as stacked layers of a protection-insulation film formed from an inorganic material and an intermediate insulation film formed from an organic material, and cases in which they are formed as a single layer intermediate insulation film formed from an organic material. In the present exemplary embodiment, in order to suppress the capacitance between common electrode lines 25 in the lower layer and the lower electrodes 14 and stabilize the characteristics of the TFT switches 4, a stacked layer structure is adopted of a photosensitive intermediate insulation film 12 and the TFT protection layer 11 formed from an inorganic material. Such a structure may be achieved by for example forming the TFT protection layer 11 using CVD film forming, coating a material for the photosensitive intermediate insulation film 12 as a coating material thereon. Then after pre-baking, and after passing through exposure and developing steps, the layers are formed by firing. The TFT protection layer 11 is then patterned by photolithographic technology. Note that this step is not required in a case in which there is no TFT protection layer 11 disposed.

Figure 12:
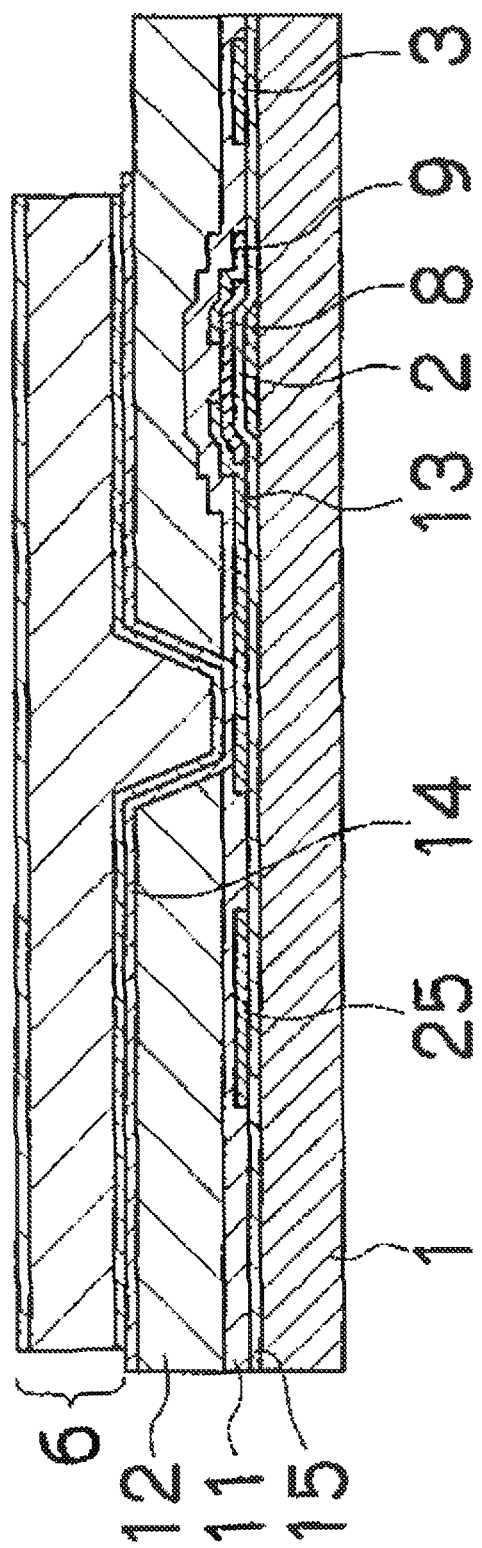
FIG. 12 is an explanatory drawing (cross-section) explaining a process following the process illustrated in FIG. 11 in the manufacturing processes of a radiation detector according to the present exemplary embodiment.

Then, as shown in FIG. 12, a sputtering method is employed to deposit a metal material such as an aluminum material or ITO onto the top layer of the layers described above. The film thickness is about 20 nm to 200 nm. The lower electrodes 14 are formed by performing patterning with photolithographic technology, and patterning with a wet etching method or a dry etching method using a metal etchant. The semiconductor layer 6 is then formed. The semiconductor layer 6 may be formed using for example a CVD method in a case in which the semiconductor layer 6 is an organic photoelectric conversion material. The film thickness is preferably 30 nm to 300 nm, more preferably 50 nm to 250 nm, and most preferably 80 nm to 200 nm. In a case in which an inorganic photoelectric conversion material is employed, the semiconductor layer 6 may be formed using a CVD method to deposit each layer of n+, i, and p+, in sequence from the bottom layer. The respective film thicknesses are, for example, n+ layer 50 nm to 500 nm, i layer 0.2 μm to 2 μm, p+ layer 50 nm to 500 nm. Each layer of the semiconductor layer 6 is deposited in sequence and patterned with photolithographic technology. The semiconductor layer 6 is then completed by selectively etching down to the intermediate insulation film 12 below using dry etching or wet etching. Note that configuration may be made as a PIN diode by depositing layers in the sequence p+, i, n+ instead of depositing layers in the sequence n+, i, p+.

Figure 13:
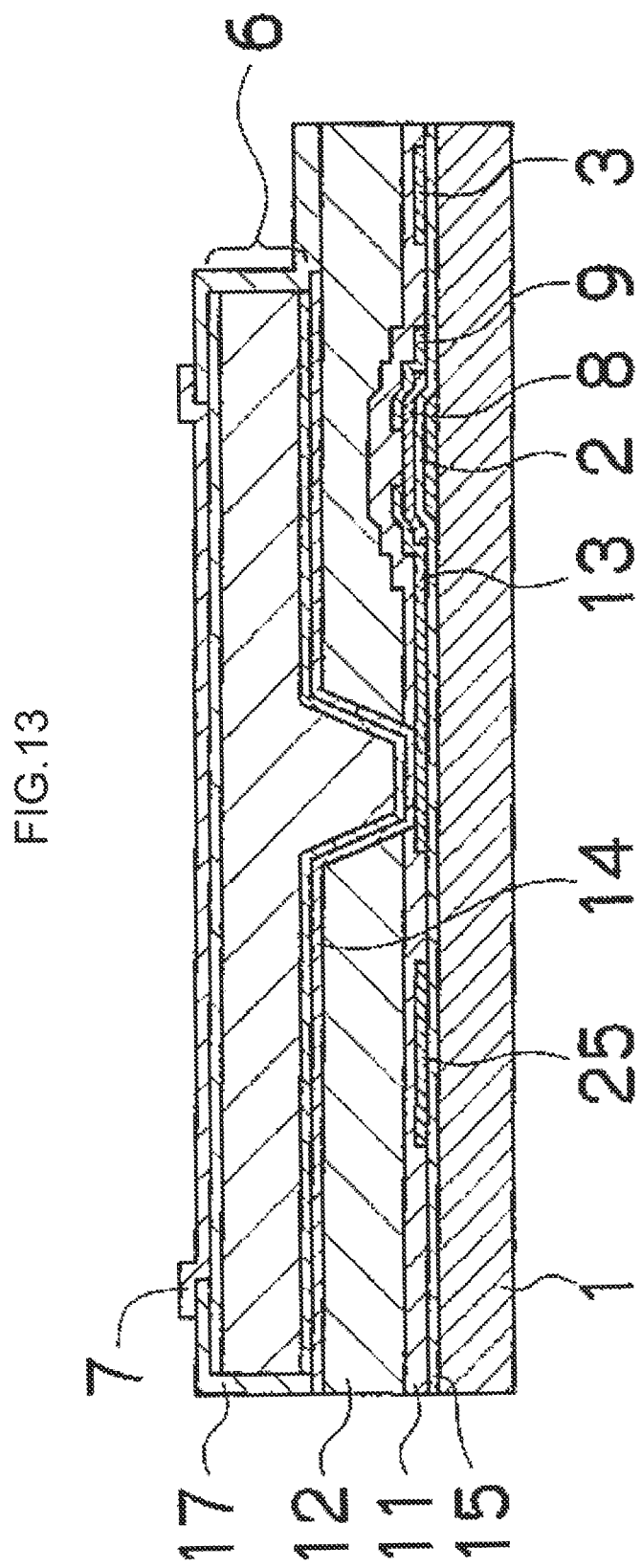
FIG. 13 is an explanatory drawing (cross-section) explaining a process following the process illustrated in FIG. 12 in the manufacturing processes of a radiation detector according to the present exemplary embodiment.

Then, as shown in FIG. 13, the protection insulation film 17 formed from an SiNx film is then deposited so as to cover the semiconductor layer 6 using, for example, a CVD method. The film thickness is about 100 nm to 300 nm. Patterning is then performed using photolithographic technology, and apertures are formed therein using a dry etching method. Note that while an example has been given in which the protection insulation film 17 is formed from SiNx using CVD film forming, there is no limitation to SiNx and any insulating material may be employed. The connection locations of the upper electrodes 7 and the common electrode lines 25 are then formed. The connection locations of the upper electrodes 7 and the common electrode lines 25 are formed above the layers that have been formed as described above by depositing a transparent conductive material such as ITO using a sputtering method. The film thickness is about 20 nm to 200 nm. Patterning is performed using photolithographic technology and using a wet etching method or a dry etching method with an ITO etchant to pattern the upper electrodes 7. The protection insulation film 17 below is not damaged due to selectively etching during this process.

Figure 14:
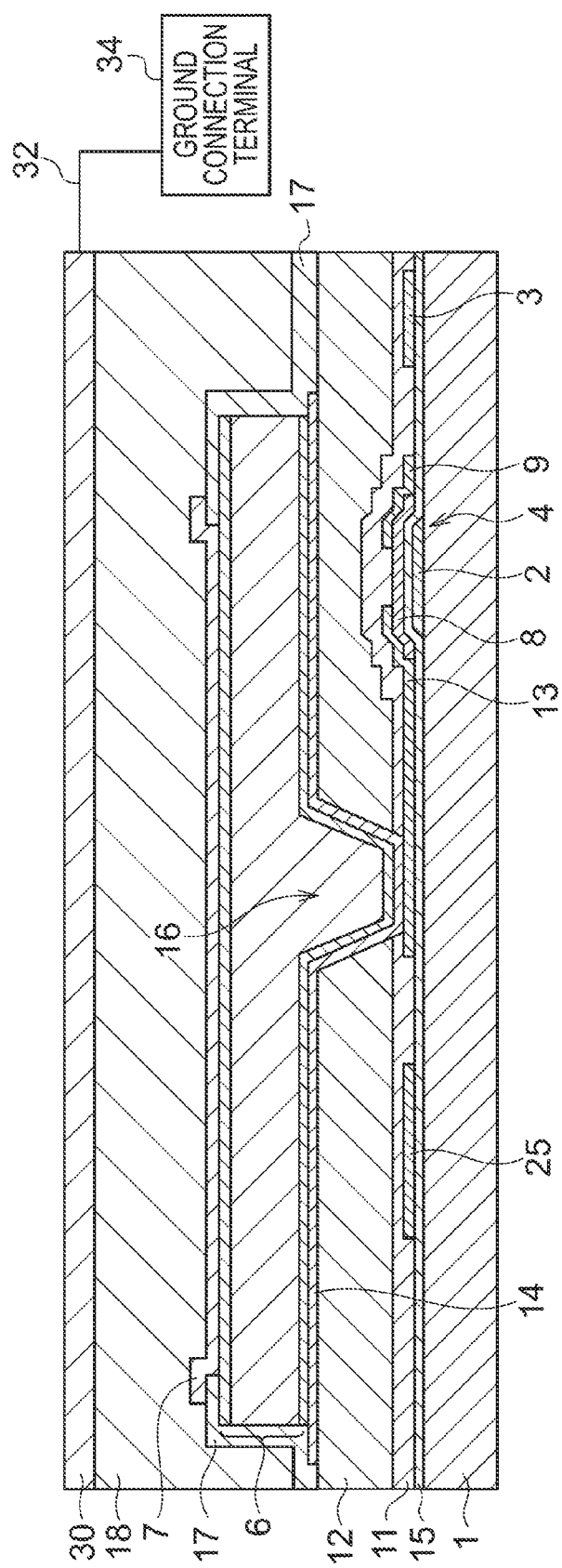
FIG. 14 is an explanatory drawing (cross-section) explaining a process following the process illustrated in FIG. 13 in the manufacturing processes of a radiation detector according to the present exemplary embodiment.

Then, as shown in FIG. 14, the SiNx flattening layer 18 is then deposited using for example a CVD method so as to cover the upper electrodes 7 and the protection insulation film 17, flattening out undulations on the surface arising, for example, from the semiconductor layer 6. While an example has been given here in which the flattening layer 18 is formed from SiNx using CVD film forming there is no limitation to SiNx and any insulating material may be employed. The conduction film 30 and the ground line 32 and the ground connection terminal 34 are then formed on the flattening layer 18 using a sputtering method with a transparent conductive material such as ITO. The film thickness of the conduction film 30 may be several tens of nm to several hundreds of nm, and the resistance of the conduction film 30 may be $10^{10}$ Ω or less. Other layers such as a protection layer may also be formed on the conduction film 30. The photoelectric conversion substrate 60 is thereby prepared by the processes described above.

Figure 15:
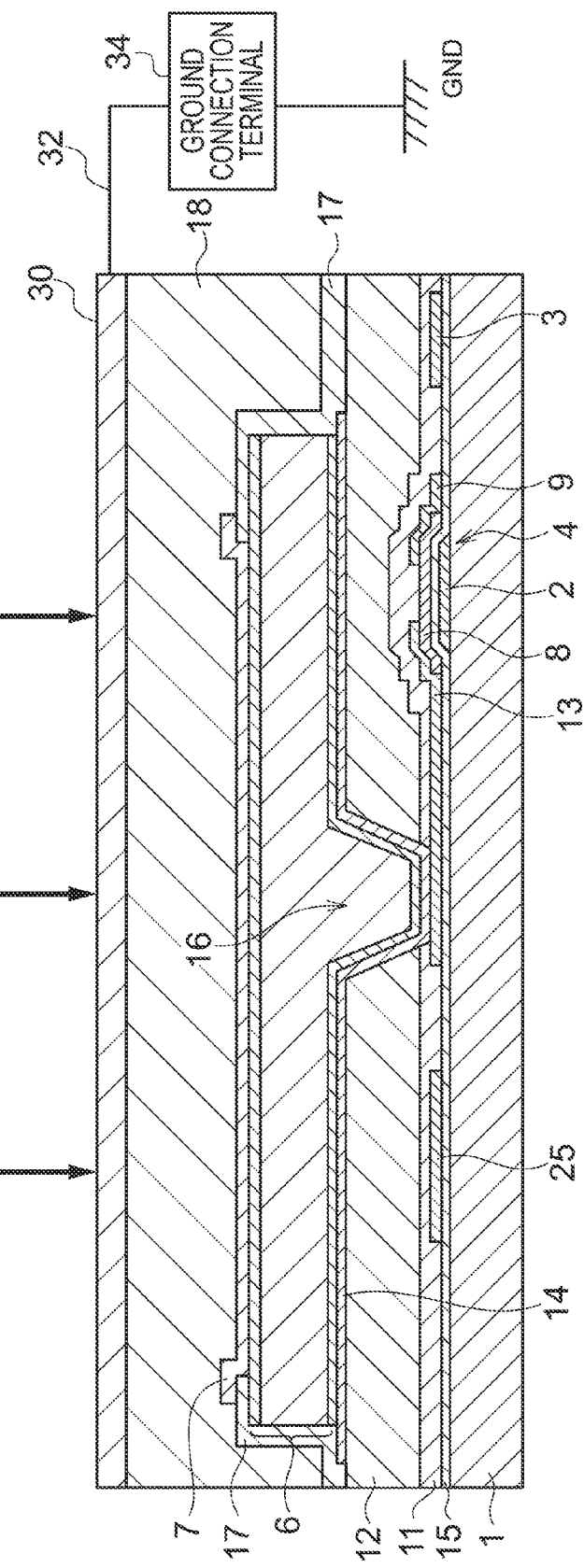
FIG. 15 is an explanatory drawing (cross-section) explaining a process following the process illustrated in FIG. 14 in the manufacturing processes of a radiation detector according to the present exemplary embodiment.

After the photoelectric conversion substrate 60 has been prepared, as pre-processing in order to enhance adhesion to the scintillator 70 the following surface treatment processes are performed, as shown in FIG. 15, to the surface of the photoelectric conversion substrate 60 (the conduction film 30). Such surface treatment is performed with the ground connection terminal 34 in a ground-connected state, namely with the conduction film 30 connected to ground through the ground connection terminal 34. Examples of surface treatment include vacuum plasma processing, atmospheric-pressure plasma processing and corona discharge treatment. By connecting the conduction film 30 to ground through the ground connection terminal 34 while such surface treatment is being performed, static buildup in the conduction film 30 can be prevented due to charge generated by surface treatment on the surface of the conduction film 30 flowing to ground. Electrostatic damage to the sensor portions 103 of the photoelectric conversion substrate 60 can accordingly be prevented. Vacuum plasma processing is preferably performed as such surface treatment from the perspective of improving adhesion to the scintillator 70.

Figure 16:
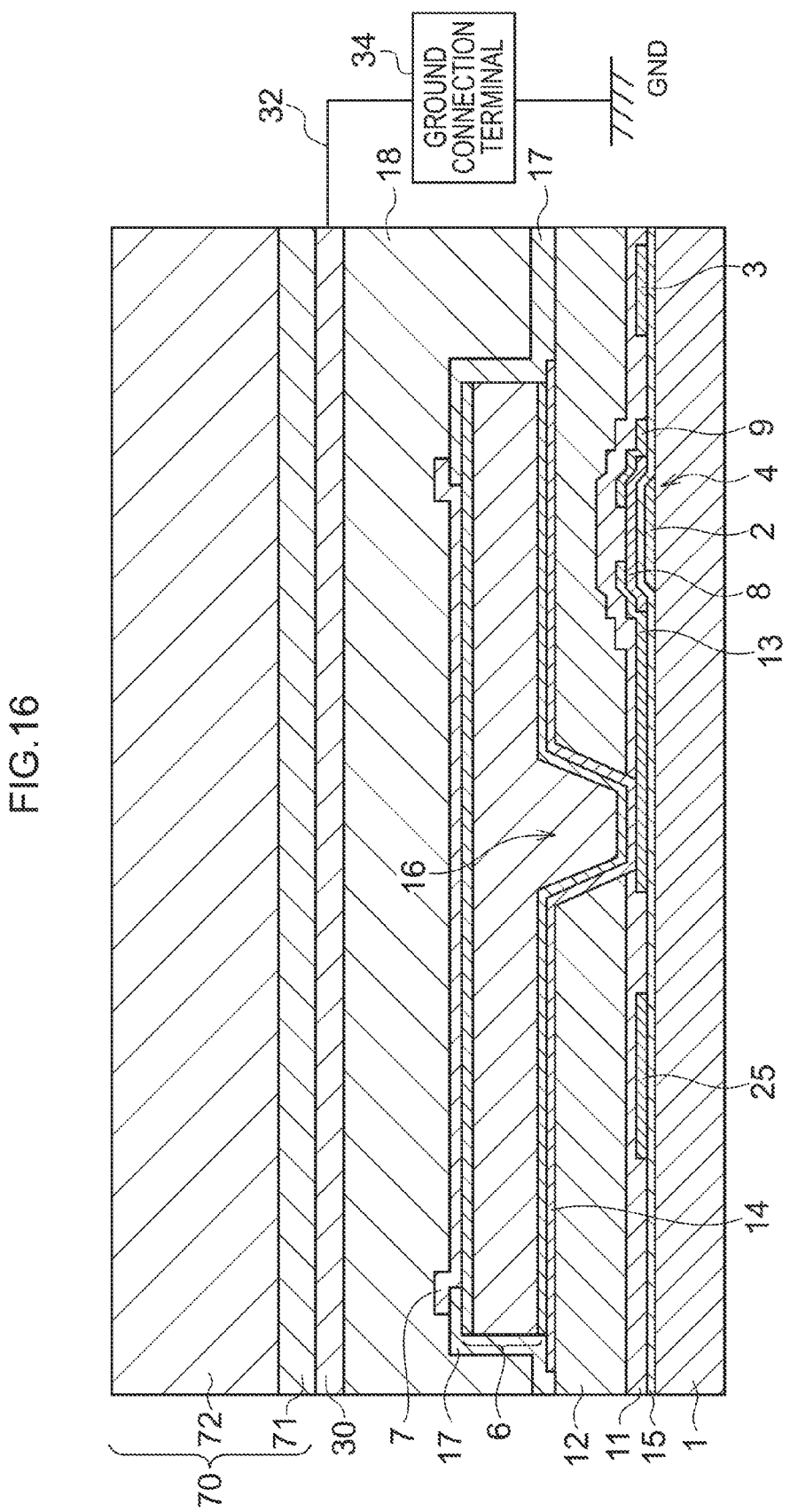
FIG. 16 is an explanatory drawing (cross-section) explaining a process following the process illustrated in FIG. 15 in the manufacturing processes of a radiation detector according to the present exemplary embodiment.

Then, as shown in FIG. 16, the scintillator 70 is formed on the conduction film 30 of the photoelectric conversion substrate 60, that has been subjected to the above surface treatment. In the present exemplary embodiment, the scintillator 70 is formed by directly depositing CsI (T1) on the photoelectric conversion substrate 60 (the conduction film 30) using a vapor deposition method such as vacuum vapor deposition. In the present exemplary embodiment, in case of forming the crystal phases on the photoelectric conversion substrate 60 the non-columnar portion 71 is formed first and then the columnar portion 72 is formed. In the present exemplary embodiment the conduction film 30 is in a ground-connected state through the ground connection terminal 34 during the processes for forming the scintillator 70, similarly to when performing surface treatment processes (see FIG. 15). While it is not always necessary for the conduction film 30 to be in a ground-connected state through the ground connection terminal 34 during these scintillator-forming processes, these processes may be performed with the conduction film 30 in a ground-connected state through the ground connection terminal 34 from the perspective of preventing electrostatic destruction due to static buildup. Further, in a case in which the conduction film 30 is formed so as to cover the terminals on the photoelectric conversion substrate 60 that are provided to connect the signal lines 3 to the signal detection circuits 105, the portion of the conduction film 30 covering the terminals is ultimately removed.

The radiation detector 10 of the present exemplary embodiment is thereby completed. In the present exemplary embodiment, after completing the radiation detector 10 the connection between the ground connection terminal 34 and ground is severed, such that the conduction film 30 is not in a ground-connected state. Note that the timing for disconnecting the conduction film 30 from ground is not limited to immediately after completing the radiation detector 10, and may be after completion of producing the radiographic image capture device 100. Consider, for example, a case in which there is a subsequent period of time for producing and finishing the radiographic image capture device 100, including processes such as connecting the scan signal control device 104, the signal detection circuits 105 to the radiation detector 10, and/or a case in which there is a possibility of static buildup in the photoelectric conversion substrate 60 during storage or transportation of the radiation detector 10. In such cases configuration may be made such that the conduction film 30 is left in a ground-connected state through the ground connection terminal 34 until a predetermined time such as a predetermined time after completion of the radiographic image capture device 100. Configuration may be made such that in order to prevent static buildup, the conduction film 30 is connected to ground (for example the frame ground of the casing of the radiographic image capture device 100) through the ground connection terminal 34 even after completion of production of the radiographic image capture device 100.

As explained above, the photoelectric conversion substrate 60 of the radiation detector 10 of the present exemplary embodiment is flattened due to provision of the flattening layer 18 on the faces of the TFT switches 4 and the sensor portions 103 that have been formed on the substrate 1, and the anti-static functioning conduction film 30 is formed over substantially the whole face of the flattening layer 18 (the whole face of the pixel region 20A in the present exemplary embodiment). The conduction film 30 is integrally formed to the ground line 32 and the ground connection terminal 34 and connectable to ground through the ground connection terminal 34. The scintillator 70 is also formed on the photoelectric conversion substrate 60 (on the conduction film 30), and the scintillator 70 is equipped with the non-columnar portion 71 and the columnar portion 72, provided in sequence from the side nearest to the photoelectric conversion substrate 60.

In the thus configured present exemplary embodiment, due to the conduction film 30 being connectable to ground through the ground connection terminal 34, surface treatment can be performed to the surface of the photoelectric conversion substrate 60 (the conduction film 30) for improving adhesion to the scintillator 70 while the conduction film 30 is placed in a ground-connected state. Static buildup on the photoelectric conversion substrate 60 (the conduction film 30) can accordingly be prevented due to any charge generated by surface treatment flowing to ground. Electrostatic damage to the sensor portions 103 due to static buildup can accordingly be prevented. The adhesion between the photoelectric conversion substrate 60 and the scintillator 70 can also be improved due to being able to employ vacuum plasma processing as surface treatment since static buildup can be prevented.

Explanation has been given of an example in the above exemplary embodiment in which the scintillator 70 is directly formed by vapor deposition on the photoelectric conversion substrate 60, however there is no limitation thereto. A separately formed scintillator 70 may be laminated to the photoelectric conversion substrate 60 using for example an adhesive resin. In such laminated cases, static buildup can be prevented and electrostatic destruction of the sensor portions 103 can be prevented by connecting the conduction film 30 to ground through the ground connection terminal 34 when the surface of the photoelectric conversion substrate 60 (the conduction layer 30) is being subjected to surface treatment in order to improve adhesion, similarly to as described above.

The photoelectric conversion substrate 60 is employed in the present exemplary embodiment, however a flexible substrate may be employed. An ultra-thin glass substrate produced by recently developed float technology may be applied as a substrate for such a flexible substrate in order to improve the transmissivity to radiation. Examples of ultra-thin glass substrates that may be applied in such cases include, for example, substrates described in the announcement published online, online search Aug. 20, 2011 "Asahi Glass Company (AGC) Develops Worlds Thinnest Sheet Float Glass at Just 0.1MM", Internet <URL:http://www.agc.com/news/2011/0516. pdf>.

Note that the configuration and operation of the photoelectric conversion substrate 60, the radiation detector 10 and the radiographic image capture device 100 explained in the above exemplary embodiment are merely examples thereof. Various changes within a range not departing from the spirit of the present invention are possible according to circumstances.

Furthermore the radiation explained in the present exemplary embodiment is not particularly limited, and radiation such as X-rays and γ-rays may be employed.

Although explanation has been given of a case in which the semiconductor layer 6 is employed for the sensor portions 103, the present invention is not limited thereto and a CMOS sensor may be applied.

What is claimed is:

1. A photoelectric conversion substrate comprising:
   a plurality of pixels, each provided with a sensor portion and a switching element that are formed on the substrate, the sensor portion comprising an upper electrode, a photoelectric conversion element that generates charge according to illuminated light, a lower electrode, and the switching element reading the charge from the sensor portion;
   a flattening layer that flattens a surface of the substrate having the switching elements and the sensor portions formed thereon and covers all regions of the plurality of pixels;
   a conducting member formed over the flattening layer; and
   a connection section that connects the conducting member to ground.

2. The photoelectric conversion substrate of claim 1, wherein the conducting member absorbs a predetermined long wavelength component of the illuminated light.

3. The photoelectric conversion substrate of claim 1, wherein the photoelectric conversion elements comprise organic photoelectric conversion elements formed with quinacridone.

4. The photoelectric conversion substrate of claim 1, wherein the conducting member has transparency to light.

5. The photoelectric conversion substrate of claim 1, wherein the conducting member is connected to the ground through the connection section.

6. A radiation detector comprising:
   the photoelectric conversion substrate of claim 1; and
   a light emitting layer that is formed on the conducting member of the photoelectric conversion substrate and that emits light according to a radiation amount of irradiated radiation.

7. The radiation detector of claim 6, wherein the light emitting layer comprises columnar crystals of an alkali halide.

8. The radiation detector of claim 7, wherein the light emitting layer comprises a non-columnar portion and a columnar portion, provided in sequence from the side nearest to the photoelectric conversion substrate.

9. The radiation detector of claim 8, wherein the non-columnar portion is in contact with the conducting member.

10. The radiation detector of claim 9, wherein the conducting member is disposed between the non-columnar portion and the flattening layer.

11. A radiographic image capture device comprising:
    the radiation detector of claim 6; and
    an image capture section that reads the charge that has been generated in the radiation detector according to the irradiated radiation and captures a radiographic image.

12. The radiation detector of claim 6, wherein the conducting member is connected to a frame ground.

13. A method of manufacturing a radiation detector, comprising:
    connecting the conducting member of the photoelectric conversion substrate of claim 1 to ground via the connection section;
    performing a surface treatment on the surface of the photoelectric conversion substrate on which the conducting member is formed while the conducting member is connected to ground; and
    forming a light emitting layer on the conducting member on which the surface treatment has been performed.

14. The method of manufacturing the radiation detector of claim 13, wherein the forming of the light emitting layer is performed while the conducting member is connected to ground.

15. The method of manufacturing the radiation detector of claim 13, wherein the light emitting layer is formed by vapor deposition of the light emitting layer on the photoelectric conversion substrate.

16. The photoelectric conversion substrate of claim 1, wherein the conducting member comprises organic colorants.

17. The photoelectric conversion substrate of claim 1, wherein the flattening layer comprises colorants.

18. The photoelectric conversion substrate of claim 1, wherein the connection section is integrally formed with the conducting member.

* * * * *